(12) United States Patent
Gibbs et al.

(10) Patent No.: US 6,384,621 B1
(45) Date of Patent: May 7, 2002

(54) PROGRAMMABLE TRANSMISSION LINE IMPEDANCE MATCHING CIRCUIT

(75) Inventors: Gary Gibbs; Manoj B. Roge, both of San Jose, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/790,372

(22) Filed: Feb. 22, 2001

(51) Int. Cl.$^7$ .................................... H03K 19/0175
(52) U.S. Cl. ...................... 326/30; 326/83; 326/87
(58) Field of Search ........................... 326/26, 27, 30, 326/82, 83, 86, 87, 63

(56) References Cited

U.S. PATENT DOCUMENTS

| | | | |
|---|---|---|---|
| 4,042,838 A | 8/1977 | Street et al. | 307/270 |
| 4,219,743 A | 8/1980 | Millns et al. | 307/270 |
| 4,484,092 A | 11/1984 | Campbell, Jr. | 307/578 |
| 4,503,343 A | 3/1985 | Ohuchi | 307/482 |
| 4,540,898 A | 9/1985 | Pumo et al. | 307/269 |
| 4,574,273 A | 3/1986 | Atsumi et al. | 307/475 |
| 4,612,462 A | 9/1986 | Asano et al. | 307/482 |
| 4,725,746 A | 2/1988 | Segawa et al. | 307/482 |
| 5,038,056 A | 8/1991 | Koide et al. | 307/448 |
| 5,057,715 A | 10/1991 | Larsen et al. | 307/451 |
| 5,073,726 A | 12/1991 | Kato et al. | 307/443 |
| 5,150,186 A | 9/1992 | Pinney et al. | 357/42 |
| 5,179,299 A | 1/1993 | Tipon | 307/443 |
| 5,216,290 A | 6/1993 | Childers | 307/296.1 |

(List continued on next page.)

FOREIGN PATENT DOCUMENTS

| | | | |
|---|---|---|---|
| EP | 0045133 | 2/1982 | H02K/5/02 |
| EP | 0046498 | 3/1982 | H03K/5/02 |
| EP | 0129661 | 2/1985 | H03K/5/02 |
| JP | 52-35570 | 3/1977 | H03K/17/12 |
| JP | 53-125753 | 2/1978 | H03K/19/08 |
| JP | 59-16424 | 1/1984 | H03K/19/094 |

OTHER PUBLICATIONS

"9–Mb Pipelined SRAM with QDR™ Architecture", CY7C1302V25, Mar. 28, 2000, pp. 1–21.

G. Sonoda, "MOSFET Powering Circuit", IBM Technical Disclosure Bulletin, vol. 13, No. 9, Feb. 1971.

T. V. Harroun, Bootstrap Inverter Driver, IBM Technical Disclosure Bulletin, vol. 19, No. 3, Aug. 1976, pp. 827–828.

"Bufferized ECL–Type Logic Circuit", IBM Corp. 1990, pp. 343–344.

Thaddeus J. Gabara et al., "Digitally Adjustable Resistors in CMOS for High–Performance Applications", IEEE Journal of Solid–State Circuits, vol. 27, No. 8, Aug. 1992, pp. 1176–1185.

H.L. Kalter et al., "Field–Effect Transistor Driver Circuit", IBM Technical Disclosure Bulletin, vol. 18, No. 4, Sep. 1975, pp. 1028–1029.

S. C. Lewis et al., "Bootstrapped FET Driver", IBM Technical Disclosure Bulletin, vol. 18, No. 11, Apr. 1976, pp. 3595–3596.

Weste et al., "CMOS VLSI Design: A Systems Perspective", Addison–Wesley, 1998, pp. 55–56.

Primary Examiner—Don Phu Le
(74) Attorney, Agent, or Firm—Christopher P. Maiorana, P.C.

(57) ABSTRACT

An apparatus comprising a first circuit, a second circuit, and an output circuit. The first circuit may be configured to generate a first digital output in response to (i) a reference input and (ii) a feedback input. The second circuit may be configured to generate a second digital output in response to (i) the first digital output and (ii) a second feedback input. The output circuit may be configured to generate a third output in response to a data input, wherein an output impedance of the output circuit is adjusted in response to (i) the first digital output and (ii) the second digital output.

20 Claims, 9 Drawing Sheets

U.S. PATENT DOCUMENTS

| | | | |
|---|---|---|---|
| 5,241,502 A | 8/1993 | Lee et al. | 365/203 |
| 5,270,588 A | 12/1993 | Choi | 307/475 |
| 5,281,869 A | 1/1994 | Lundberg | 307/443 |
| 5,319,259 A | 6/1994 | Merrill | 307/443 |
| 5,365,118 A | 11/1994 | Wilcox | 327/109 |
| 5,373,199 A | 12/1994 | Shichinohe et al. | 327/328 |
| 5,381,061 A | 1/1995 | Davis | 326/57 |
| 5,399,920 A | 3/1995 | Van Tran | 326/83 |
| 5,444,397 A | 8/1995 | Wong et al. | 326/81 |
| 5,514,994 A | 5/1996 | Sawada | 327/390 |
| 5,528,166 A | 6/1996 | Iikbahar | 326/27 |
| 5,559,447 A | 9/1996 | Rees | 326/30 |
| 5,565,794 A | 10/1996 | Porter | 3236/81 |
| 5,587,678 A | 12/1996 | Dijkmans | 327/108 |
| 5,606,275 A | 2/1997 | Farhang et al. | 327/108 |
| 5,656,571 A | 8/1997 | Miller et al. | 504/116 |
| 5,717,343 A | 2/1998 | Kwong | 326/27 |
| 5,732,027 A | 3/1998 | Arcoleo et al. | 365/189.05 |
| 5,781,034 A | 7/1998 | Rees et al. | 326/86 |
| 5,828,262 A | 10/1998 | Rees | 327/390 |
| 5,874,838 A | 2/1999 | Rees | 326/86 |
| 5,877,647 A | 3/1999 | Vajapey et al. | 327/391 |
| 5,894,241 A | 4/1999 | Rees | 327/390 |
| 5,898,321 A | 4/1999 | Ilkbahar | 326/87 |
| 6,225,819 B1 | 5/2001 | Rees et al. | 326/30 |

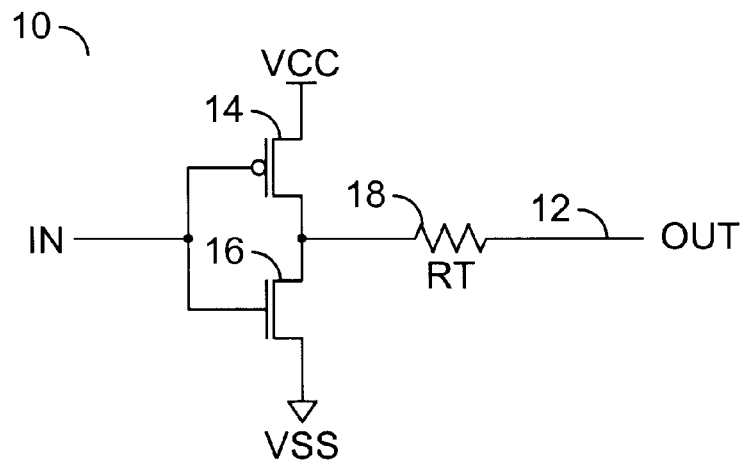
FIG. 1
(CONVENTIONAL)

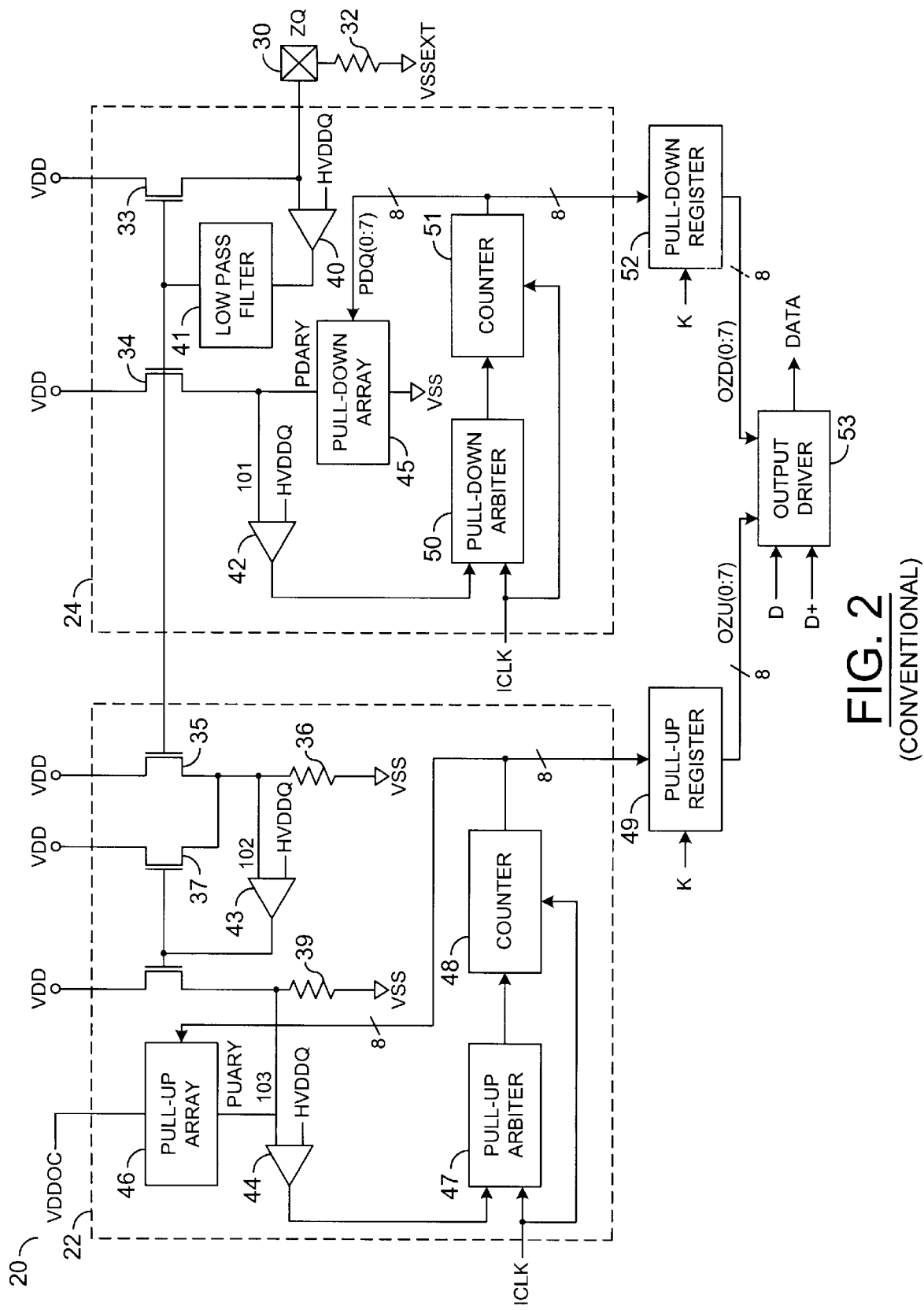
FIG. 2
(CONVENTIONAL)

PROGRAMMABLE TRANSMISSION LINE IMPEDANCE MATCHING CIRCUIT

FIELD OF THE INVENTION

The present invention relates to a method and/or architecture for transmission line impedance matching generally and, more particularly, to a method and/or architecture for programmable transmission line impedance matching.

BACKGROUND OF THE INVENTION

In integrated circuits, such as microprocessors, memories, and the like, signals may be routed for relatively long distances using transmission lines. A transmission line may be a bus, a printed circuit board trace, or other type of relatively long metal line for transporting a digital signal. Typically, a printed circuit board trace has a characteristic impedance of between 50 and 75 ohms. The receiving end, or far end, of the transmission line can be connected to an input of a logic circuit, where the input impedance is higher than the characteristic impedance of the transmission line. If the impedance coupled to the far end of the transmission line is different than the impedance of the transmission line, the signal can be reflected back to the sending end, causing the signal to overshoot a desired steady state voltage for the logic state. The signal may be reflected back and forth many times between the near end of the transmission line and the far end of the transmission line. The reflected signal can cause oscillatory behavior of the signal at both ends of the transmission line. The repeated overshooting and undershooting of the signal is commonly known as "ringing", and results in reduced noise immunity and increased time for the signal to become, and remain, valid at the far end.

Referring to FIG. 1, a diagram of a circuit 10 illustrating a complementary metal-oxide semiconductor (CMOS) output driver is shown. The circuit 10 is used to provide enough current to drive a signal the length of a transmission line 12. The CMOS driver circuit 10 includes a P-channel transistor 14 and an N-channel transistor 16 connected in series between a positive power supply voltage terminal VCC and a ground terminal VSS. The gates of the transistors receive an input signal IN, and an output terminal of the driver circuit is located between the transistors. The P-channel transistor 14 functions as a "pull-up" transistor, and the N-channel transistor 16 functions as a "pull-down" transistor. The output impedance of the driver circuit 10 is set by a series resistor 18. The resistor 18 has a resistance Rt that is selected to match the characteristic impedance of the transmission line 12. The impedance must be matched in order for the driver circuit to absorb the reflected signal and prevent ringing. Depending on the particular application in which the driver circuit 10 is installed, the load impedance that the driver circuit is required to drive can vary. The output circuit 10 has a disadvantage of requiring a separate discrete resistor for each output. The resistors must be changed for different transmission line impedances.

Referring to FIG. 2, a diagram of a circuit 20 illustrating a conventional buffer circuit having a variable output impedance is shown. The output buffer circuit 20 has an output impedance that is adjustable. An external resistor 32 having a resistance that is a multiple of the desired output impedance is coupled to the output buffer circuit 20. A voltage across the resistor 32 is converted to a digital codes using analog-to-digital (A/D) converters 22 and 24. A digital code from the A/D converters 22 and 24 are used to adjust a resistance of binary weighted transistor arrays 45 and 46 to match the resistance of the external resistor 32.

A plurality of binary weighted output transistors in the output driver are selected in response to the digital codes to adjust the output impedance of the output buffer circuit 20. The output impedance can be adjusted by changing the resistance of external resistor 32. A description of the circuit 20 may be found in U.S. Pat. No. 5,606,275, which is hereby incorporated by reference in its entirety. The circuit 20 has the disadvantages of (i) a single update algorithm that can have a slow settling time on power-up and (ii) abrupt impedance changes during updates due to the binary-weighted transistor arrays.

SUMMARY OF THE INVENTION

The present invention concerns an apparatus comprising a first circuit, a second circuit, and an output circuit. The first circuit may be configured to generate a first digital output in response to (i) a reference input and (ii) a feedback input. The second circuit may be configured to generate a second digital output in response to (i) the first digital output and (ii) a second feedback input. The output circuit may be configured to generate a third output in response to a data input, wherein an output impedance of the output circuit is adjusted in response to (i) the first digital output and (ii) the second digital output.

The objects, features and advantages of the present invention include providing a method and/or architecture for a programmable transmission line impedance matching circuit that may (i) match an impedance of one or more output drivers to an impedance of one or more transmission lines using a single discrete resistor, (ii) provide a test mode output impedance of 50 ohms, (iii) provide a minimum output impedance mode, (iv) provide separate control for pull-up and pull-down, (v) provide a controlled impedance over the entire switching range, (vi) use a binary search process to determine impedance on power-up, and/or (vii) use different processes for power-up and updates.

BRIEF DESCRIPTION OF THE DRAWINGS

These and other objects, features and advantages of the present invention will be apparent from the following detailed description and the appended claims and drawings in which:

FIG. 1 is a diagram illustrating a CMOS output driver;

FIG. 2 is a diagram illustrating a conventional output buffer circuit;

DETAILED DESCRIPTION OF THE PREFERRED EMBODIMENTS

Figure 3:
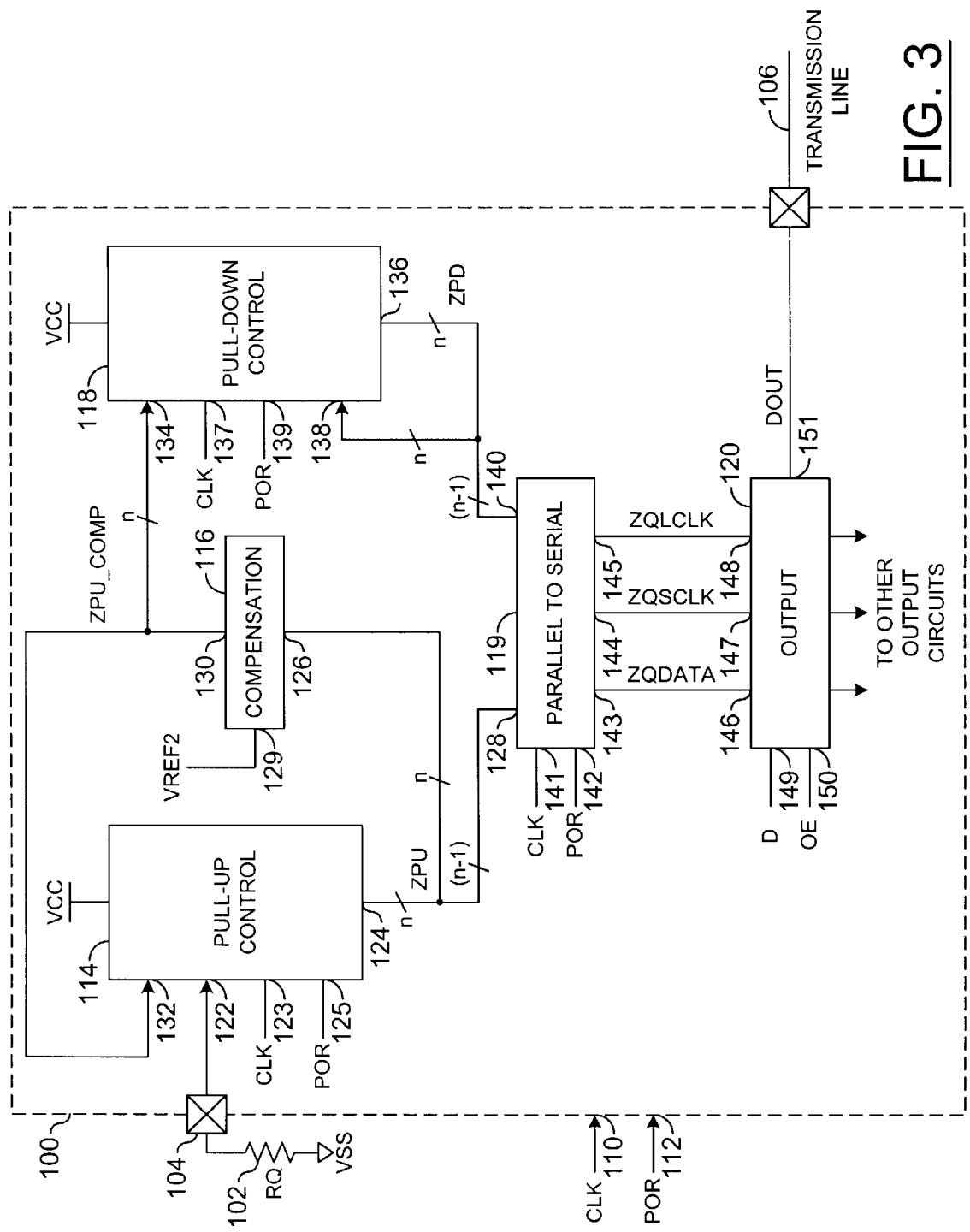
FIG. 3 is a block diagram illustrating a preferred embodiment of the present invention.

Referring to FIG. 3, a block diagram of a circuit 100 illustrating a preferred embodiment of the present invention is shown. The circuit 100 may be configured to select an output drive impedance in response to a reference impedance. In one example, an external precision resistor 102 having a predetermined value (e.g., Rq) may be used for the reference impedance. The resistor 102 may be connected between a pin 104 on a chip and a system ground (e.g., VSS). The resistor 102 may be used to match the impedance of an output driver circuit to that of a transmission line 106 connected to a pin 108 of the chip. In one example, a number of output circuits may have impedances set in response to the resistance of the resistor 102.

The value Rq of the resistor 102 may be chosen to be a multiple of the desired output impedance. In one example, the resistor 102 may be implemented having an impedance of five times the desired output impedance (e.g., a 250 ohm resistor may be used to set an output impedance of 50 ohm). The circuit 100 may be configured to provide a margin of error. In one example, the error margin may be 10 percent. A minimum error may be obtained when the resistance Rq of the resistor 102 has a value in the range of 175 ohm to 350 ohm. However, other ranges may be implemented to meet the design criteria of a particular application.

The circuit 100 may be configured to provide a minimum output impedance mode when the pin 104 is connected directly to a supply voltage (e.g., VDD). The circuit 100 may be further configured to provide a 50 ohm output impedance when the pin 104 is connected directly to the voltage supply ground VSS. In general, the pin 104 is not allowed to float.

The circuit 100 may have an input 110 that may receive a clock signal (e.g., CLK) and an input 112 that may receive a signal (e.g., POR). The signal POR may indicate when the circuit 100 is powered up. The circuit 100 may be configured to power up with an output impedance set at a default value. In one example, the default value may be 50 ohms. The circuit 100 may require a number of clock cycles of the signal CLK to reach an optimum output drive impedance corresponding to the resistance Rq of the resistor 102, following power-up. In one example, the circuit 100 may take 512 clock cycles. However, the circuit 100 may be operable with fewer than 512 clock cycles.

Over time, variations may occur in supply voltage and temperature. The variations may eventually change the output driver impedance. The circuit 100 may be configured to repeatedly sample the value of the resistor 102 after a predetermined period. For example, the output impedance may be updated once every 2048 clock cycles. The impedance updates generally do not affect the operation of the circuit 100. The circuit 100 may be configured to maintain predetermined timing and current specifications during an output impedance update.

The circuit 100 may comprise a circuit 114, a circuit 116, a circuit 118, a circuit 119, and one or more of a circuit 120. The circuit 114 may be a pull-up control circuit. The circuit 116 may be a compensation circuit. The circuit 118 may be a pull-down control circuit. The circuit 119 may be a parallel to serial conversion circuit. The circuit 120 may be an output driver circuit. The pin 104 may be connected to an input 122 of the circuit 114. The circuit 114 may have an input 123 that may receive the signal CLK, an output 124 that may present a signal (e.g., ZPU), and an input 125 that may receive the signal POR. The circuit 114 may be configured to generate the signal ZPU in response to the impedance of the resistor 102 and the signals CLK, POR, and a feedback of the signal ZPU. The signal ZPU may be presented to an input 126 of the circuit 116. A portion of the signal ZPU (e.g., ZPU[n:1]) may be presented to an input 128 of the circuit 119. The signal ZPU may be implemented as a digital signal that may represent the resistance Rq of the resistor 102. The signal ZPU may be an n-bit signal, where n is an integer. In one example, the signal ZPU may be an 8-bit signal. The circuit 114 may be configured to generate the signal ZPU having a maximum value in response to the pin 104 being connected to the supply voltage VCC.

The circuit 116 may have an input 129 that may receive a reference voltage (e.g., VREF2) and an output 130 that may present a signal (e.g., ZPU_COMP) to an input 132 of the circuit 114 and input 134 of the circuit 118. The circuit 116 may be configured to generate the signal ZPU_COMP in response to the signals ZPU and VREF2. In one example, the circuit 116 may be configured to generate the signal ZPU_COMP by level shifting the signal ZPU. The circuit 116 may be configured to compensate for a difference between the supply voltage of the output circuit (e.g., VDD) and the supply voltage of the control circuit 114 and 116 (e.g. VCC). Because the supply voltages may be different, the transistors of the control circuits 114 and 116 and the output circuit 120 may operate at different points of the V-I characteristics curves. Operating at different points on the V-I curves may be a major source of error in the output impedance selected.

The circuit 118 may have an output 136 that may present a signal (e.g., ZPD), an input 137 that may receive the signal CLK, and an input 139 that may receive the signal POR. The signal ZPD may be implemented as a digital signal that may represent the resistance Rq of the resistor 102. The signal ZPD may be an n-bit signal, where n is an integer. In one example, the signal ZPD may be an 8-bit signal. The signal ZPD may be presented as a feedback signal to an input 138 of the circuit 118. The circuit 118 may be configured to generate the signal ZPD in response to the signals ZPU_COMP, CLK, POR, and ZPD. A portion of the signal ZPD (e.g., ZPD[n:1]) may be presented to an input 140 of the circuit 119.

The circuit 119 may have an input 141 that may receive the signal CLK, an input 142 that may receive the signal POR, an output 143 that may present a signal (e.g., ZQDATA), an output 144 that may present a signal (e.g., ZQSCLK), and an output 145 that may present a signal (e.g., ZQLCLK). The signal ZQDATA may be a serial data signal. The signals ZQSCLK and ZQLCLK may be clock signals. The signal ZQSCLK may be implemented as a shift clock. The signal ZQLCLK may be implemented as a load clock. The circuit 119 may be configured to (i) load a number of the bits of the signals ZPU and ZPD in response to the signal ZQLCLK. The circuit 119 may be configured to shift out the loaded bits of the signals ZPU and ZPD as the signal ZQDATA in response to the signal ZQSCLK. Converting the signals ZPU and ZPD to a serial signal generally reduces the amount of area needed for connecting the signals to the one or more output circuit 120.

The signals ZQDATA, ZQSCLK, and ZQLCLK may be presented to inputs 146, 147, and 148 of the circuit 120, respectively. The signals ZQDATA, ZQSCLK, and ZQLCLK may be presented to multiple output driver circuits of a chip. The circuit 120 may be configured to recover the signals ZPU and ZPD from the signal ZQDATA using the signals ZQSCLK and ZQLCLK. The circuit 120 may have an input 149 that may receive a data signal (e.g., D), an input 150 that may receive an enable signal (e.g., OE), and an output 151 that may present a signal (e.g., DOUT) to the pin 108. The circuit 120 may be configured to generate a signal DOUT in response to the signals D, OE, ZPU, and ZPD. The signals ZPU and ZPD may be used to adjust the output impedance of the circuit 120 and other output circuits (not shown). The signals ZPU and ZPD may comprise n-bit wide digital signals, where N is an integer. In one example, the n−1 most significant bits of the signals ZPU and ZPD may be used by the circuit 120. The output circuit 120 may be configured to switch on a number of impedance elements proportional to the numeric values of the signals ZPU and ZPD.

Figure 4:
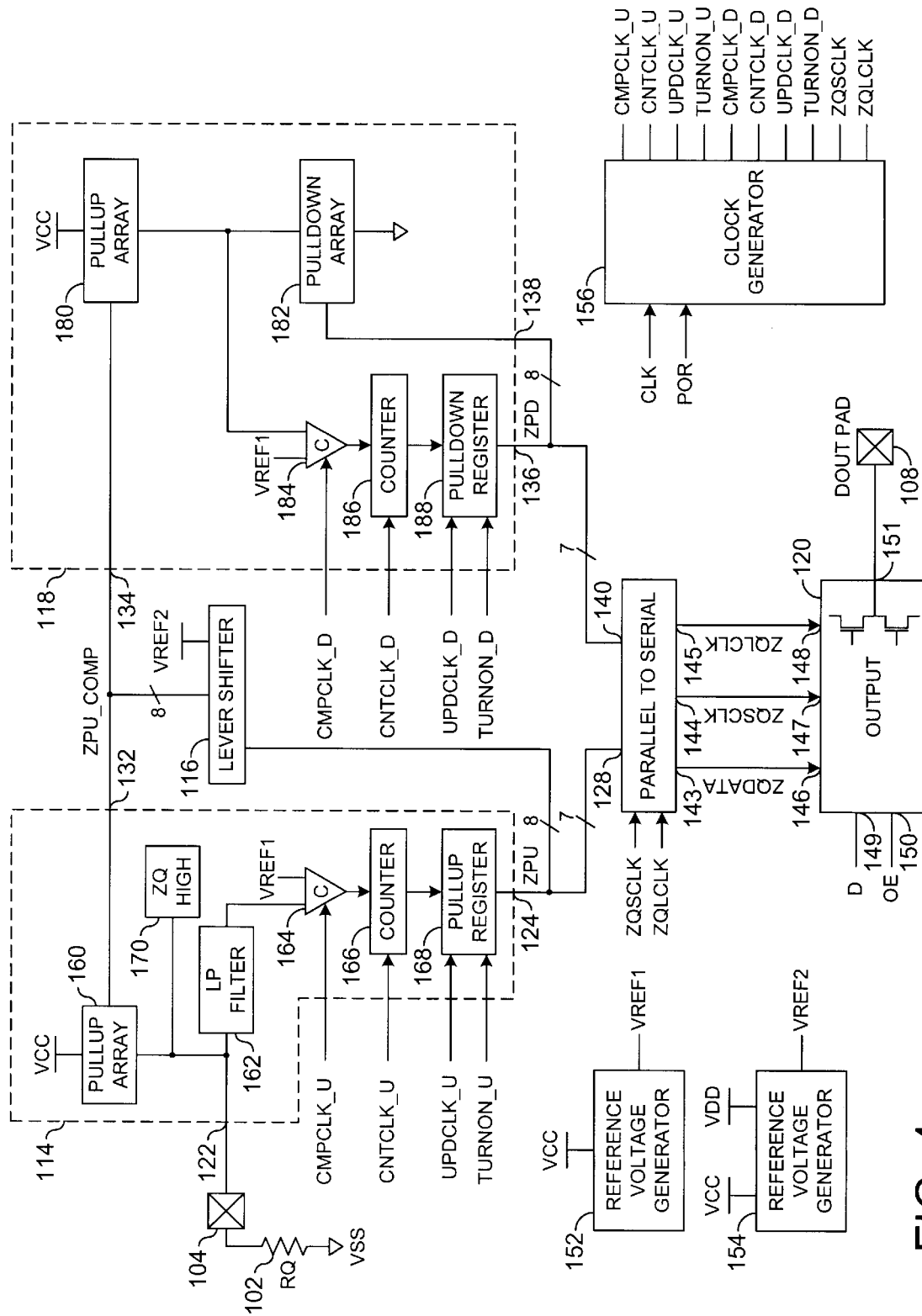
FIG. 4 is a more detailed block diagram of a preferred embodiment of the present invention.

Referring to FIG. 4, a more detailed block diagram of the circuit 100 is shown. The circuit 100 may further comprise a voltage reference circuit 152, a voltage reference circuit 154, and a clock generator circuit 156. The voltage reference circuit 152 may be configured to generate a reference voltage signal (e.g., VREF1) in response to the supply voltage VCC. The voltage reference 154 may be configured to generate the reference voltage VREF2 in response to the supply voltages VCC and VDD.

In one example, the signals CLK and POR may be presented to the clock generator circuit 156 instead of the circuits 114, 116, and 119. The clock generator circuit 156 may be configured to generate a number of signals (e.g., CMPCLK_U, CMPCLK_D, CNTCLK_U, CNTCLK_D, UPDCLK_U, UPDCLK_D, TURNON_U, TURNON_D, ZQSCLK, ZQLCLK, etc.) in response to the signals CLK and POR. The signals CMPCLK_U, CMPCLK_D, CNTCLK_U, CNTCLK_D, UPDCLK_U, and UPDCLK_D may be clock signals that may be used to time various steps in the process of generating the signals ZPU and ZPD. The signals TURNON_U and TURNON_D may be used to select a default value for the signals ZPU and ZPD, respectively. The signals CMPCLK_U, CNTCLK U, UPDCLK_U and TURNON_U may be different than the signals CMPCLK_D, CNTCLK_D, UPDCLK_D, and TURNON_D.

The circuit 114 may comprise a pull-up array 160, a low-pass filter 162, a comparator 164, a counter 166, and a register 168. The signal ZPU_COMP may be presented to an input of the pull-up array 160. An output of the pull-up array 160 and the pin 104 may be connected to an input of the low-pass filter 162. An output of the low-pass filter 162 may be connected to a first input of the comparator 164. The reference voltage VREF1 may be presented to a second input of the comparator 164. The signal CMPCLK_U may be presented to a control input of the comparator 164. An output of the comparator 164 may be presented to an input of the counter 166. The signal CNTCLK_U may be presented to a control input of the counter 166. An output of the counter 166 may be presented to the register 168. The signals UPDCLK_U and TURNON_U may be presented to inputs of the register 168. The signal ZPU may be presented at an output of the register 168. The circuit 114 may also comprise a voltage detector circuit 170. The circuit 170 may be configured to detect when the pin 104 is connected to a supply voltage (e.g., VCC). The circuit 114 may be configured to generated the signal ZPU having a predetermined value in response to the pin 104 being connected to the supply voltage.

The circuit 118 may comprise a pull-up array 180, a pull-down array 182, a comparator 184, a counter 186, and a register 188. The signal ZPU_COMP may be presented to an input of the pull-up array 180. The signal ZPD may be presented to an input of the pull-down array 182. An output of the pull-up array 180 and an output of the pull-down array 182 may be connected to a first input of the comparator 184. The reference voltage VREF1 may be presented to a second input of a comparator 184. The signal CMPCLK_D may be presented to a control input of the comparator 184. An output of the comparator 184 may present a signal to an input of the counter 186. The signal CNTCLK_D may be presented to a control input of the counter 186. The counter 186 may have an output that may present a signal to an input of the register 188. The signals UPDCLK_D and TURNON_D may be presented to inputs of the pull-down register 188. The signal ZPD may be presented at an output of the register 188.

The circuit 119 may be configured to receive the signals ZQSCLK and ZQLCLK from the circuit 156. The circuit 119 may generate the signal ZQDATA in response to the signals ZQSCLK, ZQLCLK, ZPU, and ZPD.

The circuit 100 may comprise a similar array of pull-up and pull-down elements. When the resistor Rq is selected as a multiple of the output impedance, the impedance of each of the pull-up and pull-down elements is generally set to a similar multiple of the impedance of the output driver elements. For example, where the resistor Rq is 5 times the desired output impedance and the output driver circuit comprises impedance elements with an impedance of 600 ohms, each pull-up and pull-down element will generally have an impedance of 3000 ohms (e.g., 5*600 ohms). In general, the pull-up and pull-down elements may be configured to maintain a 2:1 resistor:transistor impedance ratio (e.g., each element comprises a 2000 ohm poly resistor and a transistor).

In one example, the resistor Rq may be selected as having a value of 250 ohms. A value for the signal ZPU may be determined before a value for the signal ZPD is determined. The comparator 164 generally compares the voltage at the node formed by the connection of the pin 104 and the output of the pull-down array 160 with the reference voltage VREF1. The output of the comparator 164 may be used to increment or decrement the counter 166 to respectively switch on or switch off pull-up elements, until the voltage level at the node Zq is equal to the voltage level VREF1. When the voltage level VREF1 is equal to VCC/2 and the voltage level at the node equals the voltage level VREF1, the net impedance in the pull-up path is generally equal to the impedance of the resistor Rq. When the resistor Rq has an impedance of 250 ohms and the pull-up elements have an impedance of 3000 ohms, the circuit 100 will generally generate a signal ZPU that may switch on 12 pull-up elements (e.g., 3000/250=12).

The pull-up array 180 may be implemented similarly to the pull-up array 160. The comparator 184 generally compares the voltage at the node formed by the connection of the outputs of the pull-up and pull-down arrays 180 and 182 with the reference voltage VREF1. The output of the comparator 184 may be used to increment or decrement the counter 186 to respectively switch on or switch off pull-down elements, until the voltage level at the node between the pull-up and pull-down arrays 180 and 182 is equal to the voltage level VREF1. When the voltage level VREF1 is equal to VCC/2 and the voltage level at the node equals the voltage level VREF1, the net impedance in the pull-up path and the pull-down path is generally equal to the impedance of the resistor Rq. For example, when the resistor Rq has an resistance of 250 ohms and the pull-up and pull-down elements have an impedance of 3000 ohms, the circuit 100 may generate the signal ZPU and the signal ZPD to switch on 12 pull-up and 12 pull-down elements (e.g., 3000/250= 12). The signals ZPU and ZPD may be sent to one or more output drivers. In the above example, the code to switch on 12 segments in the output driver circuit may be shifted out to produce an output impedance of 50 ohms. The signals ZPU and ZPD may have different values depending on the impedances of the elements in the pull-up and pull-down arrays.

In one implementation of the circuit 100, the counters 166 and 186 may be 8 bit counters. However, counters with other numbers of bits may be implemented accordingly to meet the design criteria of a particular application. In a preferred embodiment, the five most significant bits may be counted in gray code. The five bits may be used to control 31 impedance segments. The three least significant bits may be counted in binary code. The three least significant bits may control three binary weighted segments. The combination of gray coded segments and binary segments may allow for finer control of the output impedance without abrupt changes during updates. In a preferred embodiment, only the seven most significant bits of the 8 bits generated by the counters 166 and 186 may be used to control the impedance of the output driver circuit 120. Dropping the least significant bit (LSB) may provide a steadier output impedance while the LSB in the control circuit is toggling during updates.

Figure 5A:
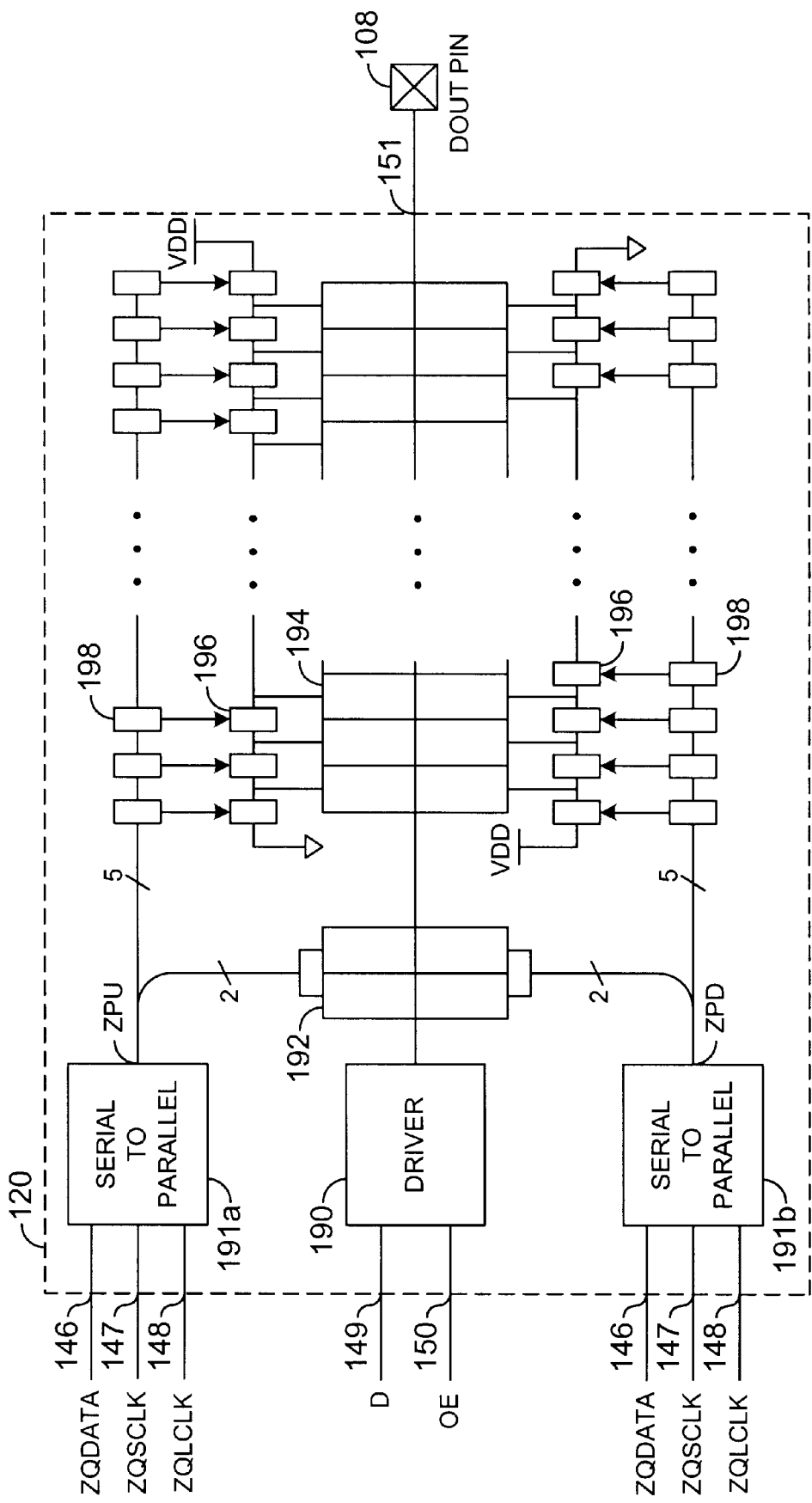
FIGS. 5(a–c) are diagrams illustrating an output circuit in accordance with the present invention.

Referring to FIG. 5a, a more detailed diagram illustrating an implementation of an output circuit of FIG. 4 is shown. The circuit 120 may comprise a driver circuit 190, a converter circuit 191a, a converter circuit 191b, a number of binary-weighted impedance segments 192, a number of gray-coded impedance segments 194, a number of pass gates 196, and a number of gray-code decoders 198. The circuit 191a may be configured to recover the signal ZPU from the signal ZQDATA in response to the signals ZQS-CLK and ZQLCLK. The circuit 191b may be configured to recover the signal ZPD from the signal ZQDATA in response to the signals ZQSCLK and ZQLCLK. In an alternative embodiment, the circuit 191a may be configured to receive clock signals that are different from the signals presented to the circuit 191b.

The number of binary-weighted impedance segments 192 and gray-coded impedance segments 194 may be determined by the number of bits of the signals ZPU and ZPD that are presented to the circuit 120. The bits of the signals ZPU and ZPD may be divided into a binary coded portion and a gray-coded portion. For example, the signals ZPU and ZPD may be presented to the circuit 120 having seven bits; two binary coded (e.g., ZPU[2:1] and ZPD[2:1]) and five gray coded (e.g., ZPU[n:3] and ZPD[n:3].

The binary coded bits may select binary weighted impedance elements 192. The gray coded bits may be decoded by the gray-code decoders 198 to select a number of gray code impedance elements 194 via the pass gates 196. The number of gray coded impedance elements selected may be greater than the number of gray-coded bits. For example, when the number of gray-coded bits is five, the number of gray-coded impedance segments may be 31.

Each of the segments 194 may be configured to drive, in one example, 1.25 mA. When VDD is 1.5V, the segments 194 may have an impedance of 600 ohms (0.75V/1.25 mA). The output driver may be configured to drive a transmission line at a level of VDD/2. When the forward wave reflects back from the end of the transmission line, the reflected wave may be superimposed over the forward wave to produce a full swing. The segments may be combined to form a desired output impedance. For example, when each segment is 600 ohms, twelve segments may be switched on to get an output impedance of 50 ohms (600/50=12). The signals ZPU and ZPD generally provide the necessary code to switch on the correct number of segments to match the impedance selected by the resistor 102. The driver circuit 190 may be configured to switch on the selected impedance segments in response to the signals D and OE.

Figure 5B:
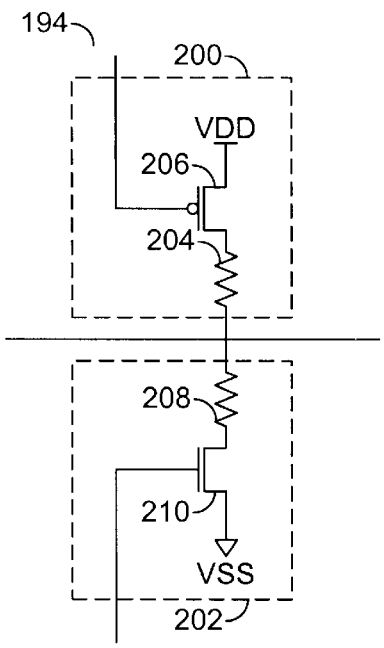

Referring to FIG. 5b, a schematic diagram of a gray coded impedance element of FIG. 5a is shown. The gray coded impedance element may comprise a pull-up segment 200 and a pull-down segment 202. The pull-up segment 200 may comprise a resistor 204 and a PMOS transistor 206. The segment 202 may comprise a resistor 208 and a NMOS transistor 210. In general, the resistance ratio of the resistor to the transistor is 2:1. The 2:1 ratio generally keeps the transistor operating in the resistive region of the characteristics of the transistor. The 2:1 ratio may provide an accurate output impedance over the range of VDD.

Figure 5C:
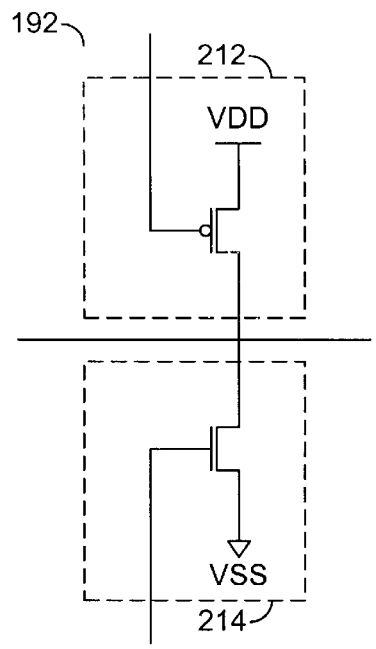

Referring to FIG. 5c, a schematic diagram illustrating an implementation of a binary-weighted impedance segment of FIG. 5a is shown. The binary-weighted impedance segments 192 may comprise a binary-weighted pull-up segment 212 and a binary-weighted pull-down segment 214. The segment 212 may be implemented as one or more PMOS transistors. The segment 214 may be implemented as one or more NMOS transistors.

Figure 6A:
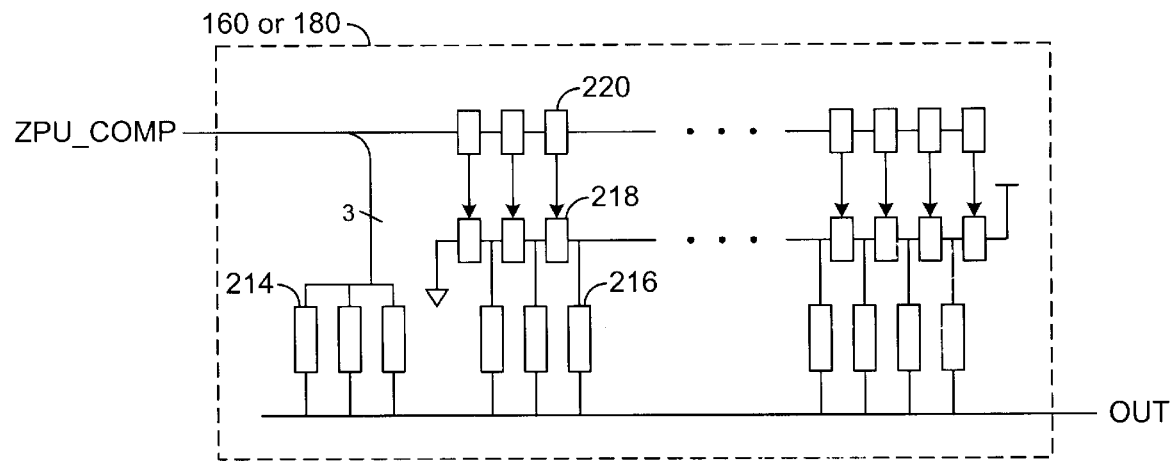
FIGS. 6(a–c) are diagrams illustrating a pull-up array of FIG. 4.

Referring to FIG. 6a, a more detailed diagram illustrating an implementation of a pull-up array of FIG. 4 is shown. The pull-up array 160 may comprise a number of binary-weighted pull-up segments 214, a number of gray-coded pull-up segments 216, a number of pass gates 218, and a number of gray-code decoders 220. The number of binary-weighted impedance segments and gray-coded impedance segments may be implemented similarly to the pull-up segments described above in connection with FIGS. 5(*a–c*). However, the impedances of the pull-up segments 214 and 216 may be different than the pull-up segments of the output circuit 120.

Figure 6B:
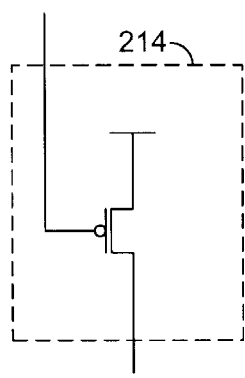

Referring to FIG. 6b, a schematic diagram illustrating an implementation of a binary-weighted pull-up segment of FIG. 6a is shown. The binary-weighted pull-up segment 214 may be implemented as one or more PMOS transistors.

Figure 6C:
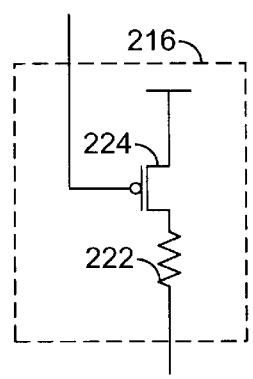

Referring to FIG. 6c, a schematic diagram of a gray coded pull-up segment of FIG. 6a is shown. The gray-coded pull-up segment 216 may comprise a poly resistor 222 and a PMOS transistor 224. When the resistor 102 is implemented as a multiple of the desired output impedance, the resistor and transistor impedances of the pull-up arrays 160 and 180 are generally implemented as a similar multiple of the impedances in the output circuit. For example, when the resistor 102 is implemented having a resistance 5× the desired output impedance, the impedance of each of the pull-up segments 214 and 216 is generally implemented as 5× the impedance of a corresponding segment in the output circuit 120 (e.g, 5*600 ohms=3000 ohms). In order to maintain the resistance ratio of the resistor to the transistor of 2:1, the resistor 222 may be implemented with a resistance of 2000 ohms while the transistor 224 may contribute 1000 ohms.

Figure 7A:
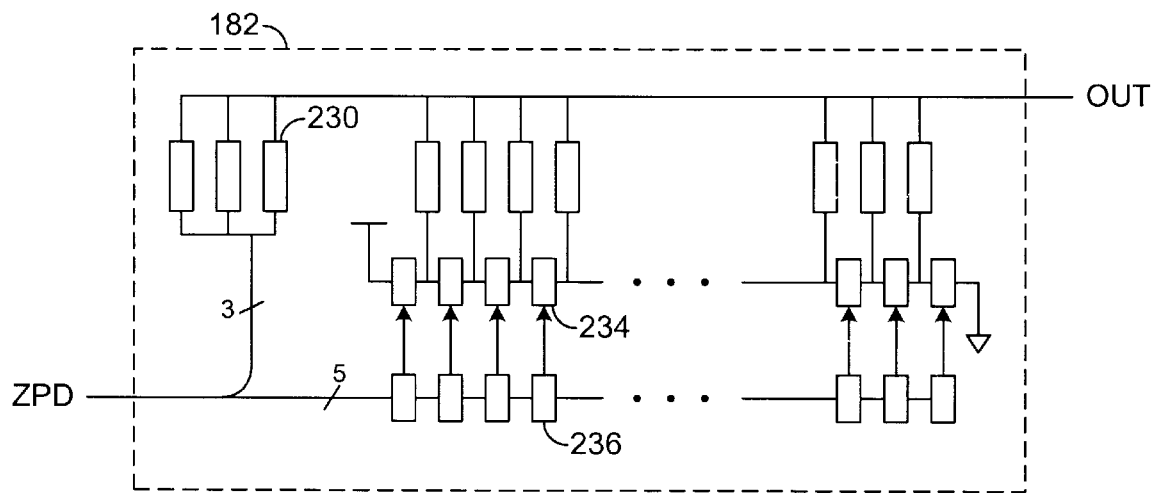
FIGS. 7(a–c) are diagrams illustrating a pull-down array of FIG. 4.

Referring to FIG. 7a, a more detailed diagram illustrating an implementation of a pull-down array of FIG. 4 is shown. The pull-down array 182 may comprise a number of binary-weighted pull-down segments 230, a number of gray-coded pull-up segments 232, a number of pass gates 234, and a number of gray-code decoders 236. The number of binary-weighted impedance segments and gray-coded impedance segments may be implemented similarly to the pull-down segments described above in connection with FIGS. 5(*a–c*). However, the impedances of the pull-up segments 230 and 232 may be different than the pull-down segments of the output circuit 120.

Figure 7B:
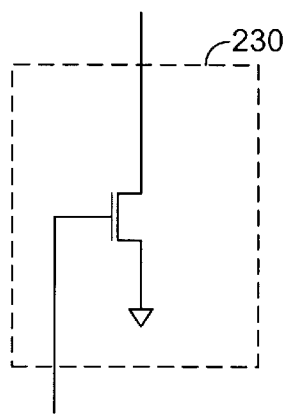

Referring to FIG. 7b, a schematic diagram illustrating an implementation of a binary-weighted pull-down segment of FIG. 7a is shown. The binary-weighted pull-down segment 230 may be implemented as one or more NMOS transistors.

Figure 7C:
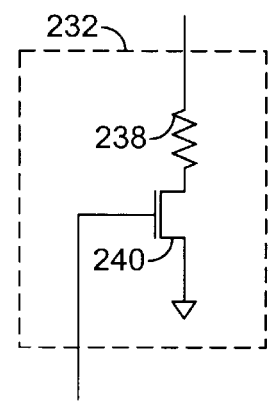

Referring to FIG. 7c, a schematic diagram of a gray coded pull-down segment of FIG. 7a is shown. The gray-coded pull-down segment 232 may comprise a poly resistor 238 and a NMOS transistor 240. When the resistor 102 is implemented as a multiple of the desired output impedance, the resistor and transistor impedances of the pull-down array 182 is generally implemented as a similar multiple of the impedance of the pull-down array in the output circuit. For example, when the resistor 102 is implemented having a resistance 5× the desired output impedance, the impedance of each of the pull-down segments 230 and 232 is generally implemented as 5× the impedance of a corresponding segment in the output circuit 120 (e.g, 5*600 ohms=3000 ohms). In order to maintain the resistance ratio of the resistor to the transistor of 2:1, the resistor 238 may be implemented having a resistance of 2000 ohms while the transistor 240 may be configured with a resistance of 1000 ohms.

Figure 8:
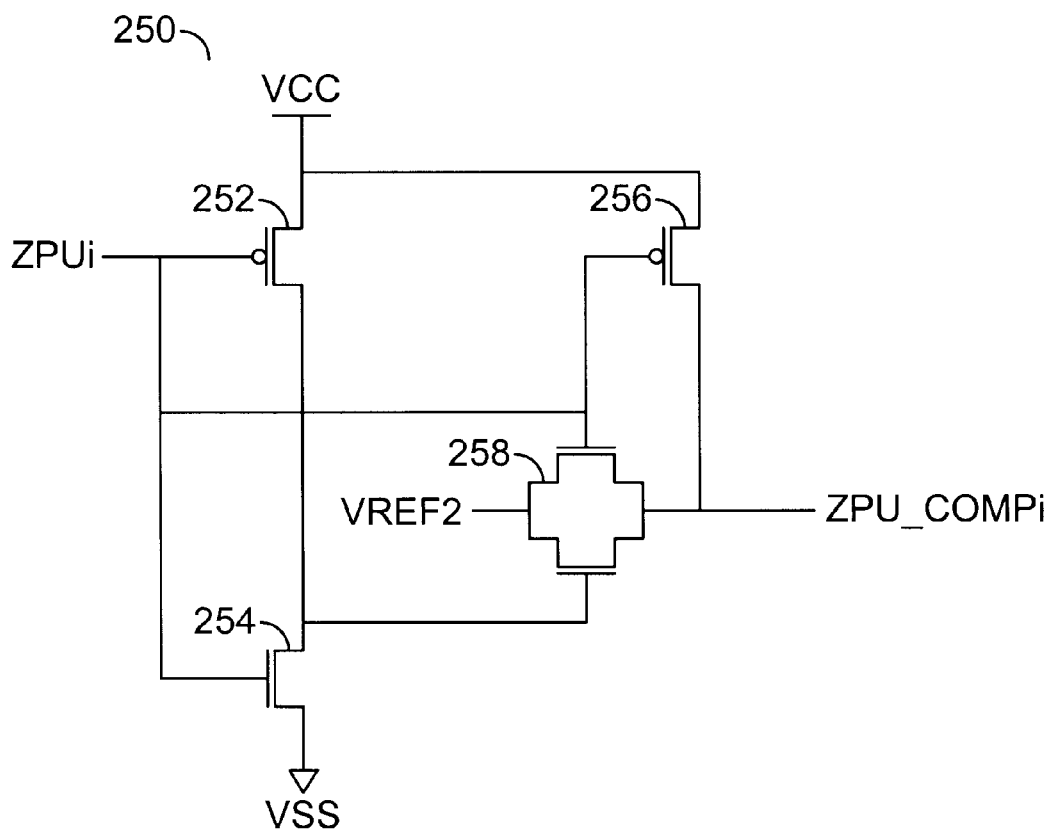
FIG. 8 is a diagram of a level shifter circuit of FIG. 5.

Referring to FIG. 8, a schematic diagram of a circuit 250 illustrating an implementation of a level shifting circuit of FIG. 4 is shown. The circuit 116 may comprise a circuit 250 for each bit of the signal ZPU (e.g., ZPUi). The circuit 250 may be configured to generate a bit of the signal ZPU_COMP (e.g., ZPU_COMPi) in response to a corresponding bit ZPUi and the reference voltage VREF2. The circuit 250 may comprise a transistor 252, a transistor 254, a transistor 256, and a CMOS pass gate 258. The transistors 252 and 256 may be implemented as one or more PMOS transistors. The transistor 254 may be implemented as one or more NMOS transistors. However, other types and polarities of transistors may be implemented accordingly to meet the design criteria of a particular application. The transistors 252 and 254 may be implemented to form a CMOS inverter.

The signal ZPUi may be presented to a gate of the transistors 252, 254, 256, and a first gate of the CMOS pass gate 258. A source of the transistors 252 and 256 may be configured to receive the supply voltage VCC. A source of the transistor 254 may be configured to receive the voltage supply ground VSS. A drain of the transistors 252 and 254 may be connected to a second gate of the CMOS pass gate 258. The reference voltage VREF2 may be presented to an input of the CMOS pass gate 258. The signal ZPU_COMPi may be presented at a node formed by a drain of the transistor 256 and an output of the CMOS pass gate 258. When the signal ZPUi is a logic LOW, the signal ZPU_COMPi is generally set to VCC. When the signal ZPUi is a logic HIGH, the signal ZPU_COMPi is generally set to VREF2. The transistor 256 may be sized larger than the transistors 252 and 254. For example, the transistor 256 may have a width/length (W/L) ratio of 8/0.5 and the transistors 252 and 254 may have a W/L ratio of 2.2/0.5.

Figure 9:
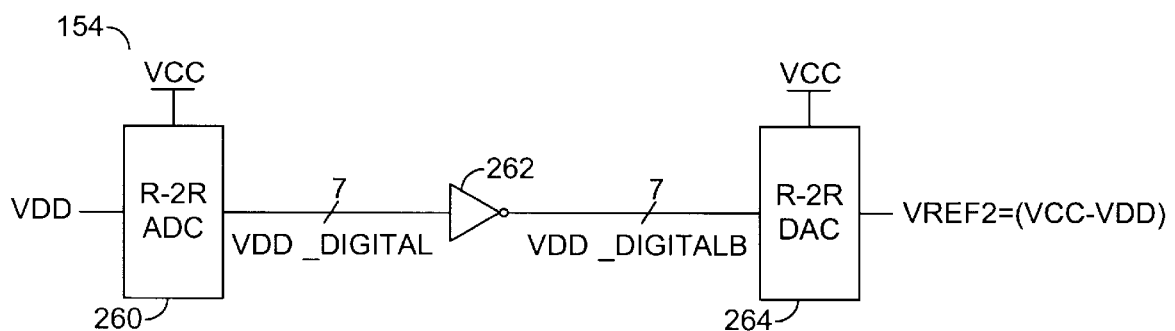
FIG. 9 is a diagram of a reference voltage generator circuit of FIG. 4.

Referring to FIG. 9, a more detailed diagram illustrating a reference voltage generator circuit 154 of FIG. 4 is shown. The supply voltage of the output driver 120 (e.g., VDD) may be lower than the supply voltage of the control circuits 114 and 116 (e.g., VCC). When the impedance elements of the output driver circuit are switched ON, the gate-source voltage (Vgs) on the output driver PMOS transistors is generally VDD. When the elements of the pull-up arrays 160 and 180 are switched ON by a control signal at the ground potential VSS, the gate-source voltage (Vgs) on the PMOS transistors of the arrays 160 and 180 is generally VCC. Operating the two transistors at different points on the V-I characteristic curve may provide a source of error in the output impedance. The circuit 116 may be configured to drive the pull-up arrays 160 and 180 at a voltage level selected to operate the transistors at the same point on the V-I characteristic curve as the output driver transistors. For example, the circuit 116 may be configured to drive the pull-up arrays at a logic LOW voltage level of VREF2 instead of VSS. The reference voltage VREF2 may be generated by the circuit 154 having a voltage level of VCC-VDD.

The circuit 154 may comprise an analog-to-digital converter (ADC) 260, a number of inverters 262, and a digital-to-analog converter (DAC) 264. The ADC 260 may be implemented, in one example, as a 7-bit R-2R ADC. The DAC 264 may be implemented, in one example, as a 7-bit 2R-R DAC. However, other types of ADCs and/or DACs and/or resolutions may be implemented to meet the design criteria of a particular application. When the DAC 264 is implemented as a 7-bit DAC, the highest voltage level (e.g., VCC) may be generated in response to a digital input of 111 1111. When VDD is two-thirds the value of VCC, a digital input of 101 0101 may be used to generate the voltage level VDD. Similarly, a voltage level of VCC-VDD may be generated in response to a digital input of 010 1010. The digital input for generating the voltage VCC-VDD is generally the digital complement of the digital input for generating the voltage VDD. The ADC 260 may be configured to generate a digital value representing the voltage VDD (e.g., VDD_DIGITAL). The inverters 262 may be used to generate the digital complement of the signal VDD_DIGITAL (e.g., VDD_DIGITALB). The DAC 264 may be configured to generate the signal VREF2 having a voltage level of VCC-VDD in response to the signal VDD_DIGITALB.

Figure 10:
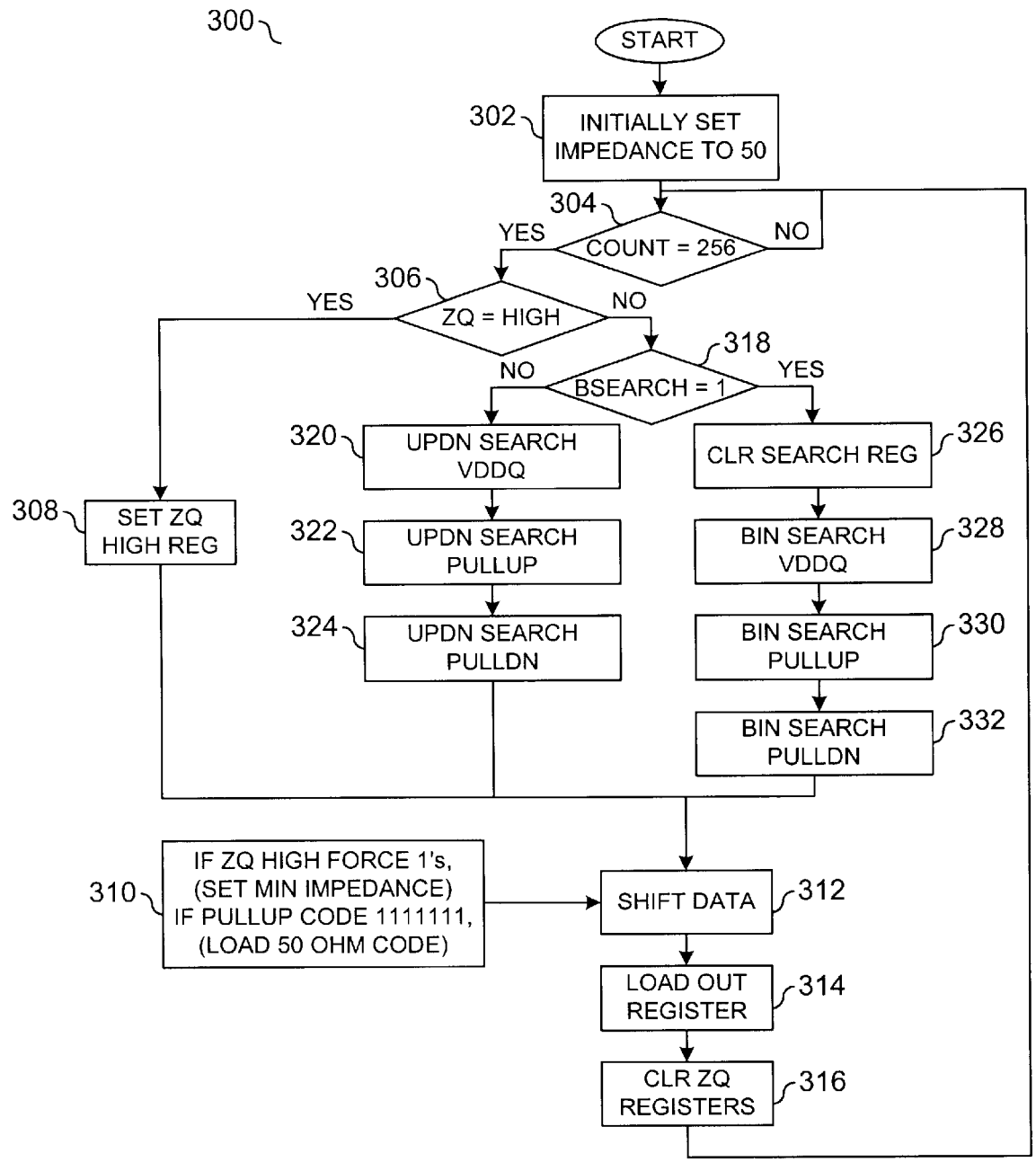
FIG. 10 is a flow diagram illustrating an example operation of a preferred embodiment of the present invention.

Referring to FIG. 10, a flow diagram 300 illustrating an example impedance matching operation in accordance with a preferred embodiment of the present invention is shown. At power on, the output impedance may be set at 50 ohms (e.g., the block 302). The impedance may be set to 50 ohms by setting a count to a maximum value (e.g., the block 304). In one example, the maximum count may be 256.

When the count is set to the maximum value, an inquiry may be made to determine whether a reference input is connected to a supply voltage (e.g., the block 306). When the reference input is connected to a supply voltage, a code may be presented that will generate a predetermined output impedance (e.g., the blocks 308 and 310). For example, a code of 1111111 may be presented to generate a 50 ohm output impedance. The code may be sent to a number of output drivers (e.g., the blocks 312, 314, and 316).

When the reference input is not connected to a supply voltage, a decision is made whether to perform a binary search or an up-down step search to determine the reference impedance (e.g., the block 318). In one example, a binary search may be performed for an initial determination of the reference impedance, and a step search may be performed to update the determination.

When a step search is selected, a sequential process may be performed to determined an operating voltage, a pullup value and a pulldown value by stepping the output code up or down (e.g., the blocks 320, 322, and 324). When a binary search is selected, the operating voltage, the pullup value and the pulldown value may be determined by a binary search (e.g., the blocks 326, 328, and 330). when the binary search process has been completed, a flag may be set to select the step search process for subsequent determinations (e.g., the block 332).

The function performed by the FLOW DIAGRAM of FIG. 10 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMs, EEPROMs, Flash memory, magnetic or optical cards, or any type of media suitable for storing electronic instructions.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a first circuit configured to generate a first digital output in response to (i) a reference input and (ii) a first feedback input;
    a second circuit configured to generate a second digital output in response to (i) said first output and (ii) a second feedback input; and
    an output circuit configured to generate a third output in response to a data input, wherein an output impedance of the output circuit is adjusted in response to (i) said first digital output and (ii) said second digital output.

2. The apparatus according to claim 1, further comprising:
    a compensation circuit configured to adjust said feedback input in response to a supply voltage of said first circuit and a supply voltage of said output circuit.

3. The apparatus according to claim 2, wherein said compensation circuit comprises one or more level shifting circuits.

4. The apparatus according to claim 3, wherein said level shifting circuit is configured to generate an output having a voltage level equal to the difference between said supply voltage of said first circuit and said supply voltage of said output circuit.

5. The apparatus according to claim 1, wherein said output circuit is configured to select one or more impedance elements coupled to said third output in response to a gray coded input.

6. The apparatus according to claim 5, wherein said output circuit further comprises one or more binary weighted transistors.

7. The apparatus according to claim 5, wherein said impedance elements comprise a resistor connected in series with a transistor.

8. The apparatus according to claim 7, wherein said resistor is made of polysilicon.

9. The apparatus according to claim 7, wherein a resistance ratio of said resistor to said transistor is 2:1.

10. The apparatus according to claim 1, wherein said digital outputs comprise a binary coded portion and a gray coded portion.

11. The apparatus according to claim 1, wherein said first circuit comprises a pull-up array coupled between said reference input and said feedback input.

12. The apparatus according to claim 1, wherein said second circuit comprises a pull-up array and a pull-down array coupled in series between a supply voltage and a supply ground.

13. The apparatus according to claim 12, wherein said first digital output is coupled to said pull-up array and said second digital output is coupled to said pull-down array.

14. The apparatus according to claim 1, wherein said output circuit has an output impedance of 50 ohms when said reference input is connect to a power supply ground.

15. The apparatus according to claim 1, wherein said output circuit is configured to present a low impedance when said reference input is connected to a power supply voltage.

16. An apparatus comprising:
    means for generating a first digital output in response to (i) a reference input and (ii) a first feedback input;
    means for generating a second digital output in response to (i) said first output and (ii) a second feedback input; and
    means for generating a third output in response to a data input, wherein an output impedance of said third output generating means is adjusted in response to (i) said first digital output and (ii) said second digital output.

17. A method for programmably matching an impedance of a transmission line comprising the steps of:
    (A) generating a first digital output in response to (i) a reference input and (ii) a first feedback input;
    (B) generating a second digital output in response to (i) said first digital output and (ii) a second feedback input; and
    (C) adjusting an output impedance in response to (i) said first digital output and (ii) said second digital output.

18. The method according to claim 17, wherein said digital outputs are generated using a binary search during a power-up mode.

19. The method according to claim 17, wherein the step (C) comprises the sub-step of:
    (C-1) decoding a portion of said digital outputs using gray code; and
    (C-2) connecting a number of impedances in parallel in response to a result of sub-step (C-1).

20. The method according to claim 17, further comprising the step of:
    (D) Compensating for a differences between a supply voltage used to generate said first digital output and said second digital output and a supply voltage used to generate said output impedance.

* * * * *